(12) United States Patent
Cheng et al.

(10) Patent No.: US 11,581,476 B2
(45) Date of Patent: Feb. 14, 2023

(54) SEMICONDUCTOR STRUCTURE AND METHOD FOR MANUFACTURING THEREOF

(71) Applicant: TAIWAN SEMICONDUCTOR MANUFACTURING COMPANY LTD., Hsinchu (TW)

(72) Inventors: Chun-Wen Cheng, Hsinchu County (TW); Chun Yin Tsai, Hsinchu (TW); Chia-Hua Chu, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 383 days.

(21) Appl. No.: 16/818,881

(22) Filed: Mar. 13, 2020

(65) Prior Publication Data
US 2021/0098681 A1   Apr. 1, 2021

Related U.S. Application Data

(60) Provisional application No. 62/907,379, filed on Sep. 27, 2019.

(51) Int. Cl.
| | |
|---|---|
| H01L 41/08 | (2006.01) |
| H01L 41/047 | (2006.01) |
| H01L 41/293 | (2013.01) |
| H01L 41/083 | (2006.01) |

(52) U.S. Cl.
CPC ........ *H01L 41/0474* (2013.01); *H01L 41/083* (2013.01); *H01L 41/293* (2013.01)

(58) Field of Classification Search
CPC . H01L 41/0474; H01L 41/083; H01L 41/293; H01L 41/0471; H01L 41/187; H01L 41/27; H01L 41/297; H01L 41/0805
See application file for complete search history.

(56) References Cited

U.S. PATENT DOCUMENTS

| | | | |
|---|---|---|---|
| 10,243,536 B2* | 3/2019 | Saijo | H03H 9/145 |
| 2015/0207057 A1* | 7/2015 | Sakuma | H01L 41/0805 347/68 |
| 2019/0288669 A1* | 9/2019 | Matsumoto | H03H 9/02015 |

* cited by examiner

*Primary Examiner* — Matthew L Reames
(74) *Attorney, Agent, or Firm* — WPAT Law; Anthony King (57) ABSTRACT

A semiconductor structure is provided. The semiconductor structure includes a substrate, a first piezoelectric layer, and a first dummy layer. The first piezoelectric layer is over the substrate, and the first piezoelectric layer has a first top surface. The first dummy layer is over the first piezoelectric layer, and the first dummy layer has a second top surface. And an average roughness of the first top surface is greater than an average roughness of the second top surface. A method for manufacturing the semiconductor structure is also provided.

20 Claims, 9 Drawing Sheets

SEMICONDUCTOR STRUCTURE AND METHOD FOR MANUFACTURING THEREOF

CROSS REFERENCE TO RELATED APPLICATION

This application claims the benefit of prior-filed U.S. provisional application No. 62/907,379, filed on Sep. 27, 2019.

FIELD

The present disclosure relates to a semiconductor structure and a method for manufacturing thereof, particularly, the semiconductor structure includes a piezoelectric layer with high-oriented crystallites.

BACKGROUND

Thin film piezoelectric materials may offer a number of advantages in microelectromechanical systems (MEMS), due to the large motions that can be generated, often with low hysteresis, the high available energy densities, as well as high sensitivity sensors with wide dynamic ranges, and low power requirements.

For instance, a piezoelectric actuator is attracting attention in the field of portable information equipment, chemical industry and medical field as a novel motor in place for an electromagnetic motor, as it can achieve a miniaturization and a high density in motors. Also, the piezoelectric actuator in its drive does not generate electromagnetic noises nor is affected by noises. Furthermore, the piezoelectric actuator is attracting attention as a technology for producing an equipment of submillimeter dimension as represented by a micromachine, and a small piezoelectric actuator is desired as a drive source for such micromachines.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

Piezoelectric thin films are demanded in manufacturing MEMS sensor, actuator and resonator applications such as energy harvesting devices, Atomic Force Microscope (AFM) cantilevers or magneto-electric sensors. Due to its reasonable piezoelectric coefficients and low permittivity, aluminum nitride (AlN) is a favorable material for such piezoelectric thin film.

Generally, several aluminum nitride layers are formed on a silicon substrate by magnetron sputter deposition, and stacked as a multilayer structure. Under certain condition, a plurality of scandium (Sc) atoms are added for forming a scandium-doped aluminum nitride layer (ScAlN) to further enhance the piezoelectricity of the layers. However, the surface of the aluminum nitride layer or the scandium-doped aluminum nitride layer may be damaged by processes such as lithography, etching, or photoresist stripping. The roughness of the surface of the aluminum nitride layer or the scandium-doped aluminum nitride layer may be increased due to those processes. Moreover, in the process of adding scandium to aluminum nitride, a plurality of abnormal grains are often be observed, and such abnormal grains may reduce dimension of c-axis in the crystalline structure of the aluminum nitride layer or the scandium-doped aluminum nitride layer.

Accordingly, some embodiments of the present disclosure provide a semiconductor structure including at least a piezoelectric layer. A top surface of such piezoelectric layer may have a low average roughness, for instance, lower than 0.4 nm, so that abnormal grains may not be formed in another piezoelectric layer subsequently formed thereon. In order to provide the average roughness as abovementioned, the present disclosure may utilize at least a dummy layer for providing a smooth surface, and therefore the piezoelectric layers formed thereon may be highly oriented.

Figure 1:
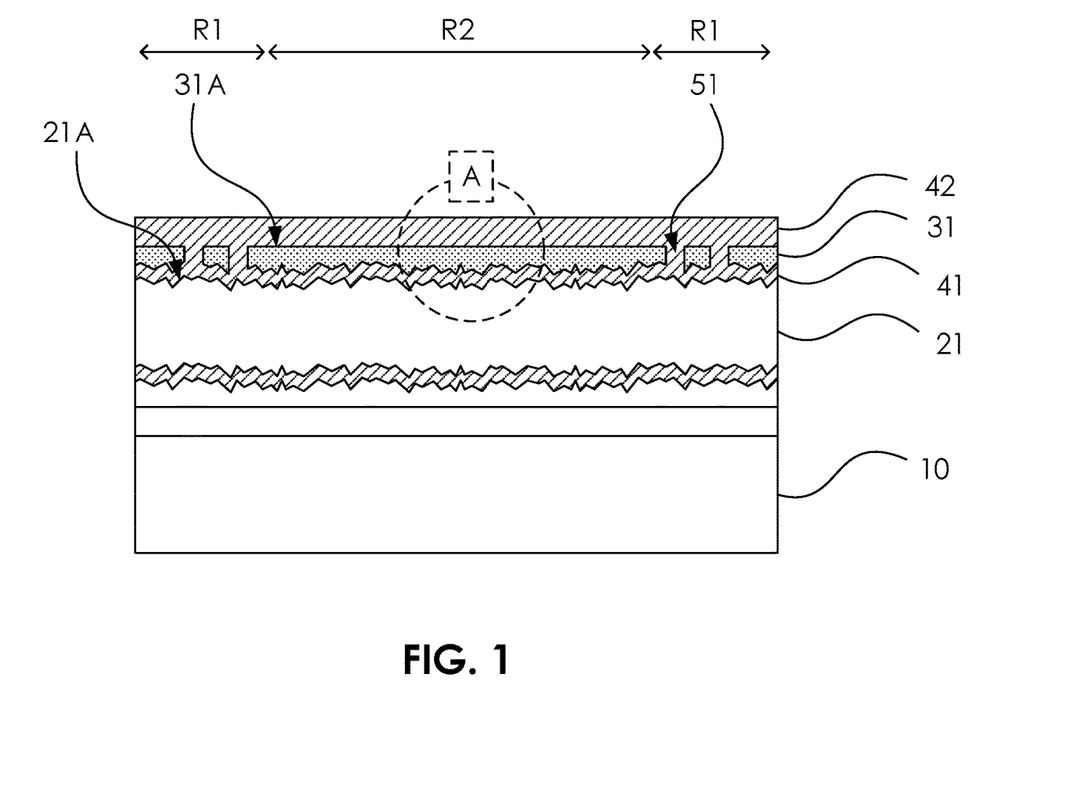
FIG. 1 illustrates a cross-sectional view of a semiconductor structure according to some embodiments of the present disclosure.

FIG. 1 illustrates a semiconductor structure according to some embodiments of the present disclosure. In some embodiments, the semiconductor structure includes a substrate 10, a first piezoelectric layer 21 and a first dummy layer 31. The first piezoelectric layer 21 is formed over the substrate 10. The first dummy layer 31 is formed over the first piezoelectric layer 21. In some embodiments, the first piezoelectric layer 21 and the first dummy layer 31 may have a first top surface 21A and a second top surface 31A, respectively, and an average roughness of the first top surface 21A is greater than an average roughness of the second top surface 31A.

Still referring to FIG. 1, in some embodiments, a first lower metal layer 41 may be formed on the first piezoelectric layer 21; the first dummy layer 31 may be formed on the first lower metal layer 41; and a first upper metal layer 42 may be formed on the first dummy layer 31. In some embodiments, the first dummy layer 31 is sandwiched by the first lower metal layer 41 and the first upper metal layer 42.

According to some embodiments, the substrate 10 may be a silicon (Si) substrate. In some other embodiments, the substrate 10 may be some other semiconductor materials such as germanium (Ge), a compound semiconductor such as silicon carbide (SiC), an alloy semiconductor including silicon germanium (SiGe), or combinations thereof. In some embodiments, the substrate 10 may be a semiconductor on insulator (SOI). In some embodiments, the substrate 10 may be an epitaxial material.

In some embodiments, the first piezoelectric layer 21 may be made by aluminum nitride or scandium-doped aluminum nitride. These piezoelectric materials may generate internal electrical charge from applied mechanical stress such as squeezing, bending or twisting. In such mechanism (i.e., piezoelectricity), the crystal of the piezoelectric material may produce a polarization which is proportional to the applied mechanical stress. The equation of piezoelectricity is $P=d_{33}*stress$, where P is the polarization and $d_{33}$ is the piezoelectric coefficient, a factor unique to each type of piezoelectric material. For instance, the piezoelectric coefficient of aluminum nitride is 5.1±0.1 pm/V.

As aforementioned, the surfaces of the layers made by piezoelectric materials may be damaged in several processes, and the average roughness of the surfaces may be increased due to the damages. Moreover, the roughness of the surfaces may induce the layers formed thereon also be less oriented in c-axis. In some circumstances, the semiconductor structure may include a plurality of piezoelectric layers, and the c-axis orientation of the piezoelectric layers proximity to the upper portion of the semiconductor structure may be worse than that of the piezoelectric layers proximity to the lower portion of the semiconductor structure. In other words, the condition of such undesired c-axis orientation of the piezoelectric layer may be amplified when a less oriented piezoelectric layer is stacked over another less oriented piezoelectric layer.

The first surface 21A of the first piezoelectric layer 21 may be damaged by processes such as lithography, etching, or photoresist stripping and having an increased average roughness thereby. Accordingly, for the purpose of avoiding less oriented piezoelectric layer formed over the first surface 21A of the first piezoelectric layer 21, the first dummy layer 31 may be formed over the first piezoelectric layer 21 for providing a smooth surface.

Figure 2:
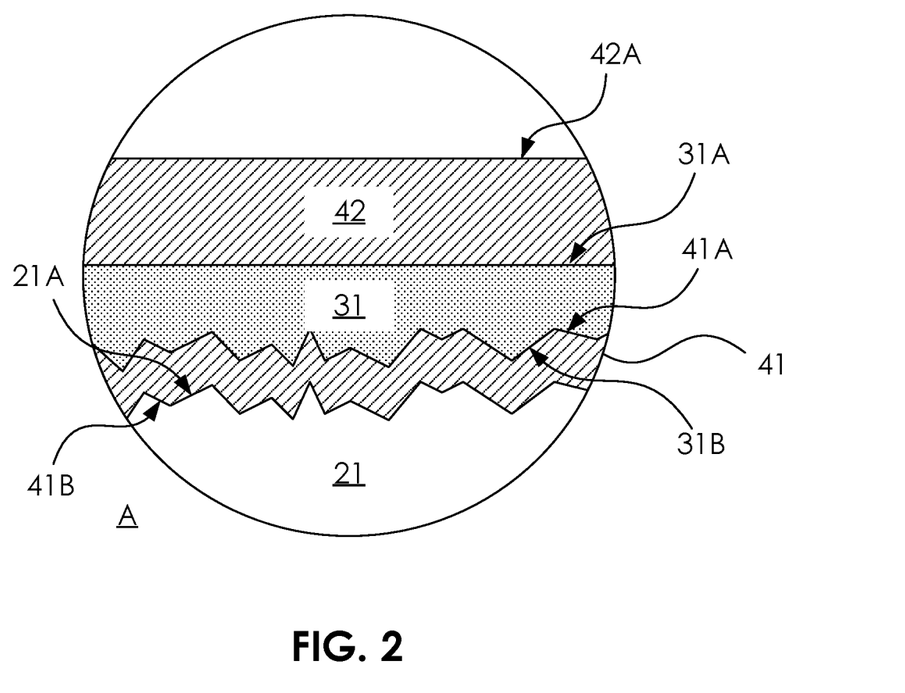
FIG. 2 illustrates an enlarged view of a portion of a semiconductor structure in FIG. 1, according to some embodiments of the present disclosure.

Referring to FIG. 2, which is enlarged from the region A in FIG. 1, the first surface 21A of the first piezoelectric layer 21 is not smooth, and the first lower metal layer 41 formed thereon may duplicate the surface profile of the first surface 21A. The first lower metal layer 41 may include a top surface 41A and a bottom surface 41B, and because the first lower metal layer 41 is a thin film with uniformity in thickness, not only the profile of the bottom surface 41B may match to the profile of the first surface 21A, but the profile of the top surface 41A may be identical to the profile of the first surface 21A of the first piezoelectric layer 21.

The first dummy layer 31 over the first lower metal layer 41 also includes a top surface 31A and a bottom surface 31B. In some embodiments, the profile of the top surface 41A may match to the profile of the bottom surface 31B, nevertheless, the profile of the top surface 31A is not identical to the profile of the top surface 41A. Instead, the top surface 31A of the first dummy layer 31 is flat and smooth by planarization techniques such as chemical-mechanical planarization (CMP). In some embodiments, an average roughness of the top surface 31A of the first dummy layer 31 is less than about 0.4 nm.

Accordingly, because the rough profile duplicate from the damaged surface (i.e., the first surface 21A of the first piezoelectric layer 21) is removed in the first dummy layer 31, the first upper metal layer 42 thereon may include a top surface 42A and a bottom surface 42B both being smooth. Therefore, in some embodiments, another piezoelectric layer formed on the top surface 42A of the first upper metal layer 42 may include a top surface with smooth profile. In some embodiments, such top surface may have an average roughness less than about 0.4 nm. In other words, the piezoelectric layer formed on the top surface 42A may be highly oriented, without amplified undesired c-axis orientation from the structures therebelow.

Still referring to FIG. 1, in some embodiments, a plurality of first conductive vias 51 may be formed in the first dummy layer 31. In such embodiments, the first lower metal layer 41 and the first upper metal layer 42 are electrically connected by the plurality of first conductive vias 51. Through the plurality of first conductive vias 51 in the first dummy layer 31, the piezoelectric layers that disposed below and above the first dummy layer 31 may be connected in series.

In some embodiments, the positions of the plurality of first conductive vias 51 may be arranged in a connection region R1 of the semiconductor structure. The connection region R1 is distinct from a non-connection region R2, and in some embodiments, the electric components in the semiconductor structure are designed to be formed within the non-connection region R2. The purpose of the distinction of the connection region R1 and the non-connection region R2 is related to the formation of the first conductive vias 51. In more detail, the forming of the first conductive vias 51 may damage the profile of the smooth surface of the first dummy layer 31 (i.e., the top surface 31A), and therefore the first upper metal layer 42 formed thereon may have a greater average roughness in the connection region R1. More detail will be described later.

Figure 3:
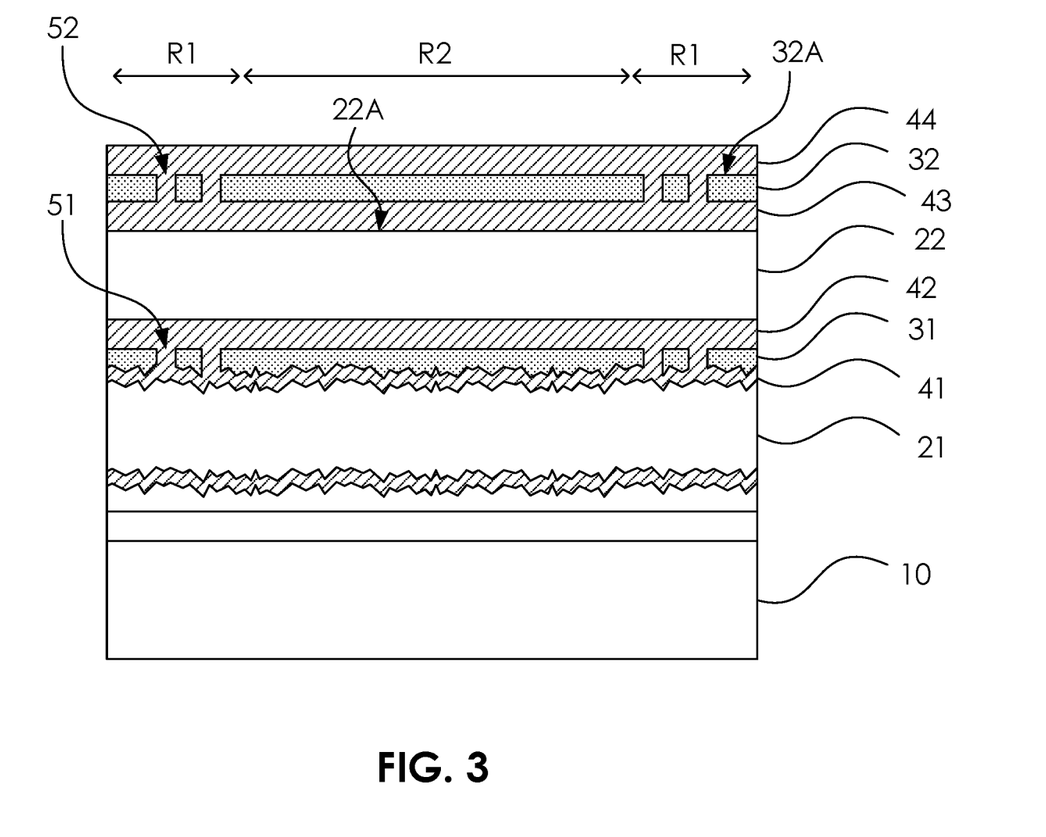
FIG. 3 illustrates a cross-sectional view of a semiconductor structure according to some embodiments of the present disclosure.

Referring to FIG. 3, in some embodiments, a second piezoelectric layer 22 may be formed on the first upper metal layer 42, and a second dummy layer 32 may be formed over the second piezoelectric layer 22. In some embodiments, a second lower metal layer 43 may be formed on the second piezoelectric layer 22, and a second upper metal layer 44 may be formed on the first dummy layer 32. In some embodiments, the second dummy layer 32 is sandwiched by the second lower metal layer 43 and the second upper metal layer 44. In some embodiments, the second lower metal layer 43 and the second upper metal layer 44 are electrically connected by a plurality of second conductive vias 52 formed in the second dummy layer 32.

Similar with the surface profile duplication from the first piezoelectric layer 21, the first lower metal layer 41, the first dummy layer 31, and the first upper metal layer 42, the surface profiles of the second piezoelectric layer 22, the second lower metal layer 43, the second dummy layer 32, and the second upper metal layer 44 may be duplicated through the stacking of the layers. Although the second piezoelectric layer 22 is formed on a smooth surface (i.e., the top surface 42A in FIG. 2), in some embodiments, a top surface 22A of the second piezoelectric layer 22 may still be damaged by some processes, and the average roughness of the top surface 22A of the second piezoelectric layer 22 may be increased thereby. By the planarization of the second dummy layer 32, a flat and smooth top surface 32A of the second dummy layer 32 may be provided for forming the second upper metal layer 44. In some embodiments, an average roughness of the top surface 32A of the second dummy layer 32 is less than about 0.4 nm.

In some embodiments, the plurality of second conductive vias 52 in the second dummy layer 32 are formed within the connection region R1 of the semiconductor structure. In some embodiments, the plurality of second conductive vias 52 are vertically aligned with the plurality of first conductive vias 51. By using the plurality of second conductive vias 52, the second piezoelectric layer 22 and the piezoelectric layer over the second dummy layer 32 may be connected in series.

Figure 4:
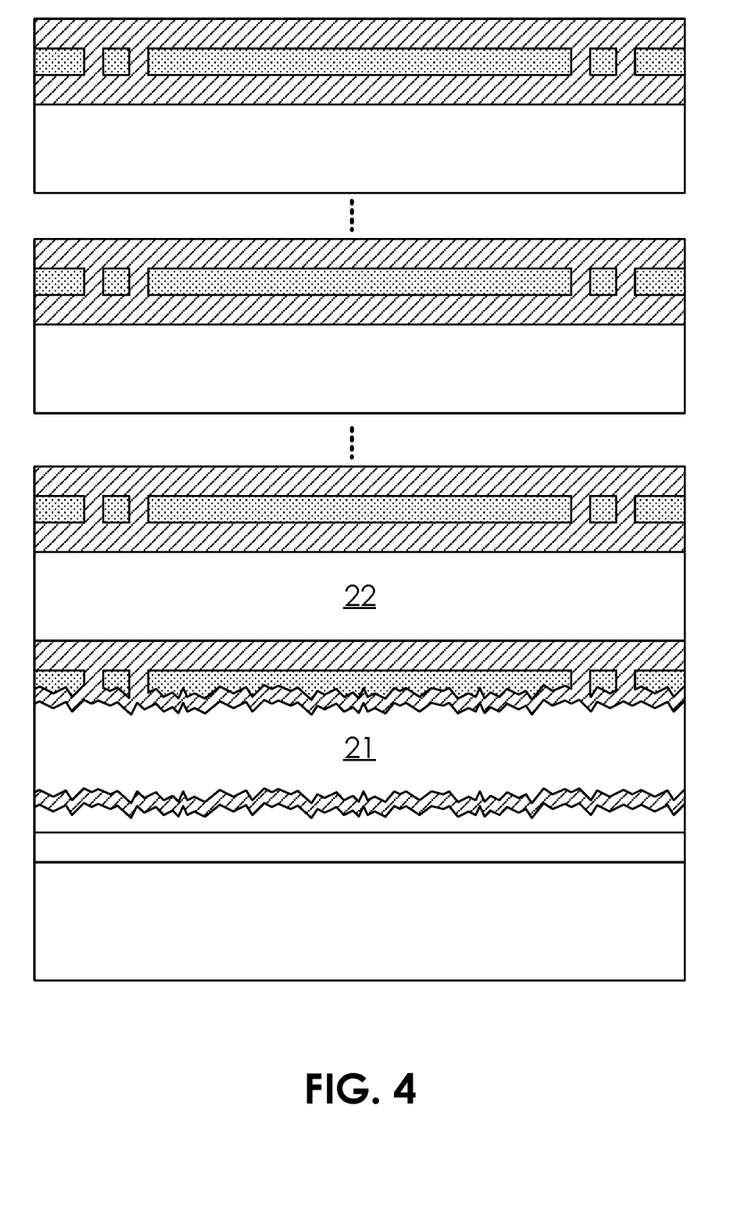
FIG. 4 illustrates a cross-sectional view of a semiconductor structure according to some embodiments of the present disclosure.

Referring to FIG. 4, in some embodiments, the semiconductor may include more than two piezoelectric layers, in other words, there may be more piezoelectric layers over the first piezoelectric layer 21 and the second piezoelectric layer 22. In some embodiments, each of the piezoelectric layers thereover may be covered by a dummy layer which is utilized to provide a flat and smooth surface for forming the piezoelectric layer thereon. Moreover, each of the dummy layers may be sandwiched by metal layers, and the metal layers adjacent to each of the dummy layers are electrically connected through the vias in the dummy layers, and therefore the piezoelectric layers over the first piezoelectric layer 21 and the second piezoelectric layer 22 may also be connected in series.

By using the dummy layers with planarized top surfaces, each of the piezoelectric layers in the semiconductor structure may have high c-axis orientation, and with such optimized crystallization, the energy loss in piezoelectric materials may be alleviated. The low energy loss may thus enhance the quality of the piezoelectric structures in the semiconductor structure such as microelectromechanical systems (MEMS) devices, movable components, surface acoustic wave (SAW) filters, or capacitors. For instance, the semiconductor structure in the present disclosure may be sensors may be used as part of a radio frequency (RF) switch, gyroscope, accelerometer, microphone membrane, resonator, or motion sensor.

In some embodiments, scandium may be added to the piezoelectric layer to increase the capacitance or the piezoelectric property of the piezoelectric layer. The adding of scandium may induce abnormally oriented grains (AOG) in the piezoelectric layers, and the grains may be observed at the piezoelectric layers from a top view perspective. In some embodiments, the grains from scandium may be performed as a plurality of irregular protrusions at the surfaces of the piezoelectric layers, thereby the roughness of the surfaces of the piezoelectric layers are increased. Like the surface of the piezoelectric layer is damaged by some semiconductor manufacturing processes as previously discussed, the c-axis orientation of the piezoelectric layer formed over the rough surface of the piezoelectric layer may be poor due to the grains from scandium. Therefore, in some embodiments, the abnormal oriented grains at the surface of each of the piezoelectric layers are covered by the dummy layers, and such dummy layers are subsequently planarized to provide a flat and smooth surface for forming another piezoelectric layer thereon. In some embodiments, the average roughness of the top surface of the dummy layer over the scandium-doped piezoelectric layer may be lower than about 0.4 nm.

Figure 5A:
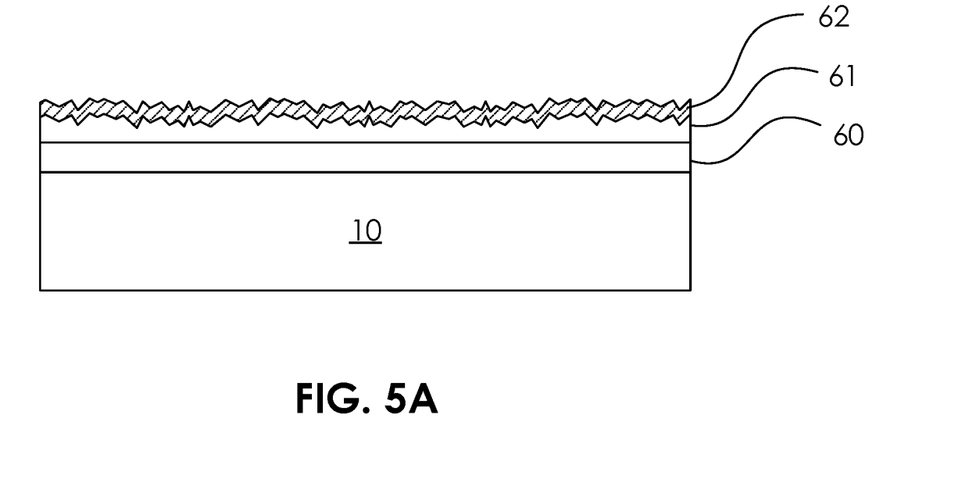
FIGS. 5A to 5J illustrate cross-sectional views at various operations of manufacturing a semiconductor structure according to some embodiments of the present disclosure.

Referring to FIG. 5A, in forming the semiconductor structure according to some embodiments of the present disclosure, the substrate 10 is provided. In some embodiments, a seed layer 60 may be formed over the substrate 10. The seed layer 60 may be used to improve the forming of the layers over the substrate 10. In some embodiments, the seed layer 60 may be a silicon oxide layer, a zinc oxide, or the like. In some embodiments, the thickness of the seed layer 50 may be in a range of from about 10 nm to about 50 nm.

In some embodiments, a bottom piezoelectric layer may be formed over the seed layer 60. The bottom piezoelectric layer 61 may be made by aluminum nitride, scandium-doped aluminum nitride. In some embodiments, some materials such as germanium that has piezoelectric property also may be used.

In some embodiments, the bottom metal layer 62 may be formed over the bottom piezoelectric layer 61. In some embodiments, the bottom metal layer 62 may be made by metal materials such as ruthenium (Ru), platinum (Pt), molybdenum (Mo), or the like. In some embodiments, the thickness of the bottom metal layer 62 may be in a range of from about 10 nm to about 50 nm.

Figure 5B:
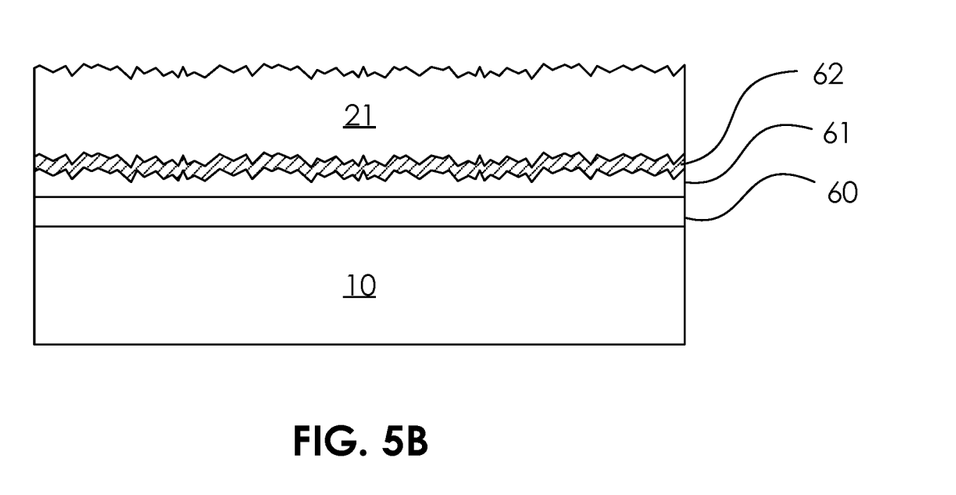

Referring to FIG. 5B, the first piezoelectric layer 21 may be formed over the substrate 10. In some embodiments, the first piezoelectric layer 21 may be formed over the bottom metal layer 62. The first piezoelectric layer 21 is much thicker than the bottom piezoelectric layer 61, and therefore, the first piezoelectric layer 21 may be seen as the substantial bulk structure of the piezoelectric layer/film of the semiconductor structure instead of the bottom piezoelectric layer 61. In some embodiments, the thickness of the first piezoelectric layer 21 is in a range of from about 0.5 μm to about 5 μm. The first piezoelectric layer 21 may be made by aluminum nitride, scandium-doped aluminum nitride or other materials with piezoelectric property. In some embodiments, the material of the first piezoelectric layer 21 is identical to the material of the bottom piezoelectric layer 61.

As aforementioned, the surface profile of the first piezoelectric layer 21 may duplicate from the layer therebelow through the deposition operation, or in some circumstances that the first piezoelectric layer 21 itself is damaged by several semiconductor manufacturing processes, or in some other circumstances that the first piezoelectric layer 21 is doped by dopants such as scandium, or the combinations thereof, the first top surface 21A of the first piezoelectric layer 21 may have a rough surface. In some embodiments, the average roughness of the first top surface 21A is greater than about 0.4 nm.

Figure 5C:
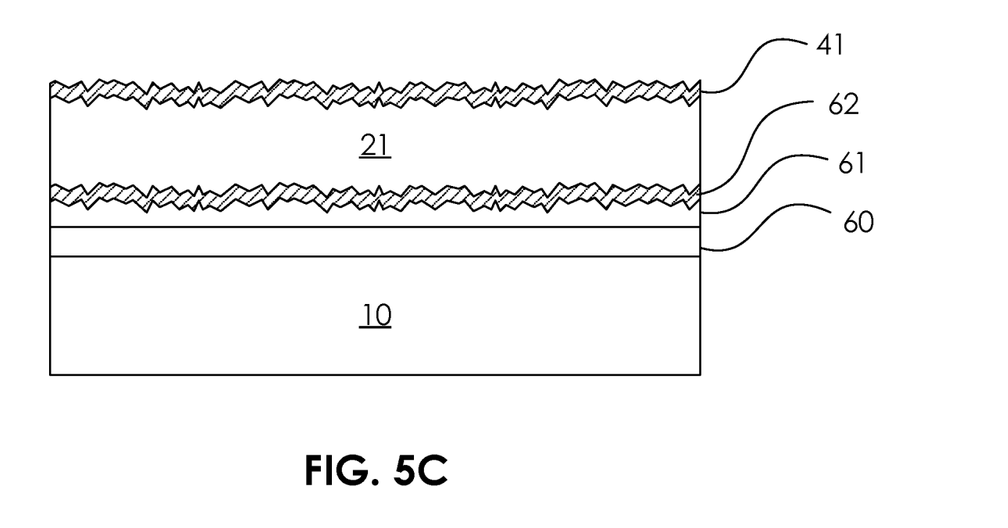

Referring to FIG. 5C, in some embodiments, the first lower metal layer 41 may be formed over the first piezoelectric layer 21 prior to forming the first dummy layer 31. In some embodiments, the first lower metal layer 41 may be made by metal materials such as ruthenium (Ru), platinum (Pt), molybdenum (Mo), or the like. In some embodiments, the thickness of the first lower metal layer 41 may be in a range of from about 10 nm to about 50 nm. In some embodiments, the thickness of the first lower metal layer 41 may be identical to the thickness of the bottom piezoelectric layer 61.

Figure 5D:
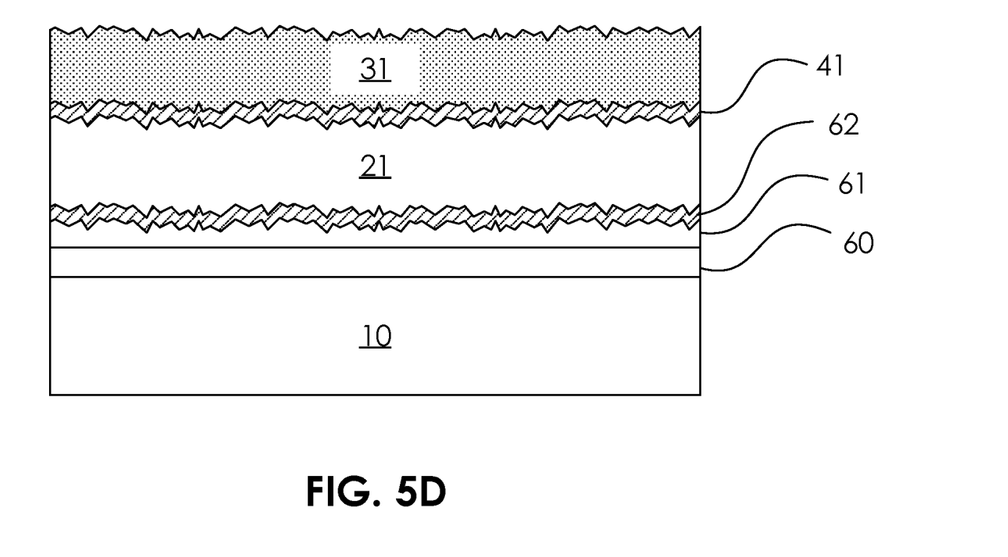

Referring to FIG. 5D, in some embodiments, the first dummy layer 31 may be formed over the first lower metal layer 41. In some embodiments, the first dummy layer 31 may be made by dielectric materials and performed as a dielectric layer. In some embodiments, the first dummy layer 31 may be made by oxides. In some embodiments, the first dummy layer 31 may be made by aluminum nitride, and therefore the aluminum-nitride-made first dummy layer 31 may be performed as the second piezoelectric layer.

Figure 5E:
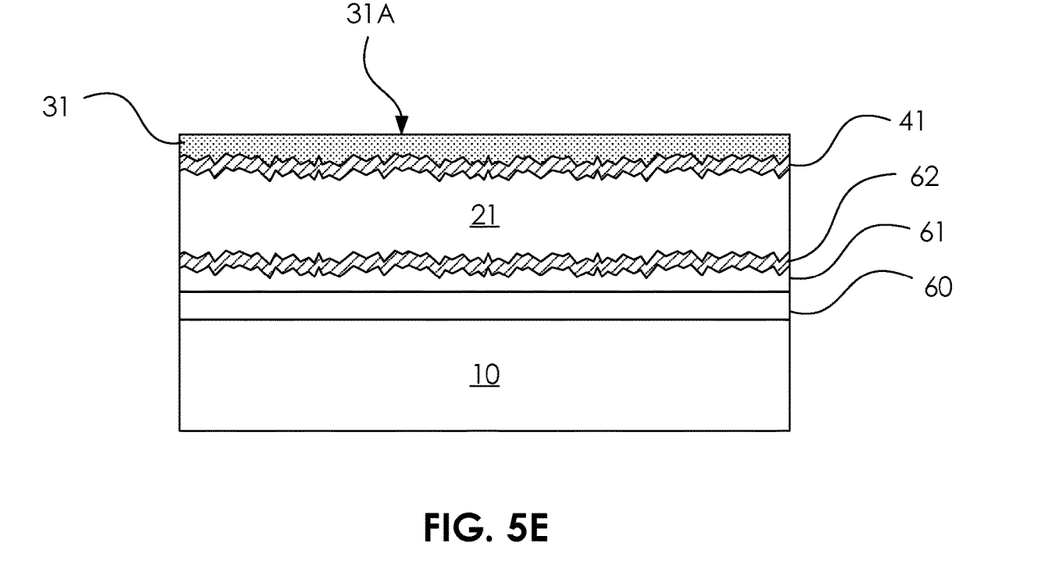

The surface profile of the first top surface 21A of the first piezoelectric layer 21 may be duplicated by the first dummy layer 31, and therefore in some embodiments, referring to FIG. 5E, the first dummy layer 31 may be planarized by using CMP process to obtain a smooth surface. In some embodiments, the average roughness of the second top surface 31A of the first dummy layer 31 is lower than about 0.4 nm. The thickness of the first dummy layer 31 may be as about 0.5 μm prior to the planarization operation and the thickness of the first dummy layer 31 may be as about 0.1 μm after the planarization operation. The remaining first dummy layer 31 still covers the layers therebelow, without exposing the layers such as the first lower metal layer 41 after the planarization operation. Thus, the planarized surface (i.e., the second top surface 31A) may replace the top surfaces there below for forming the second piezoelectric layer.

Figure 5F:
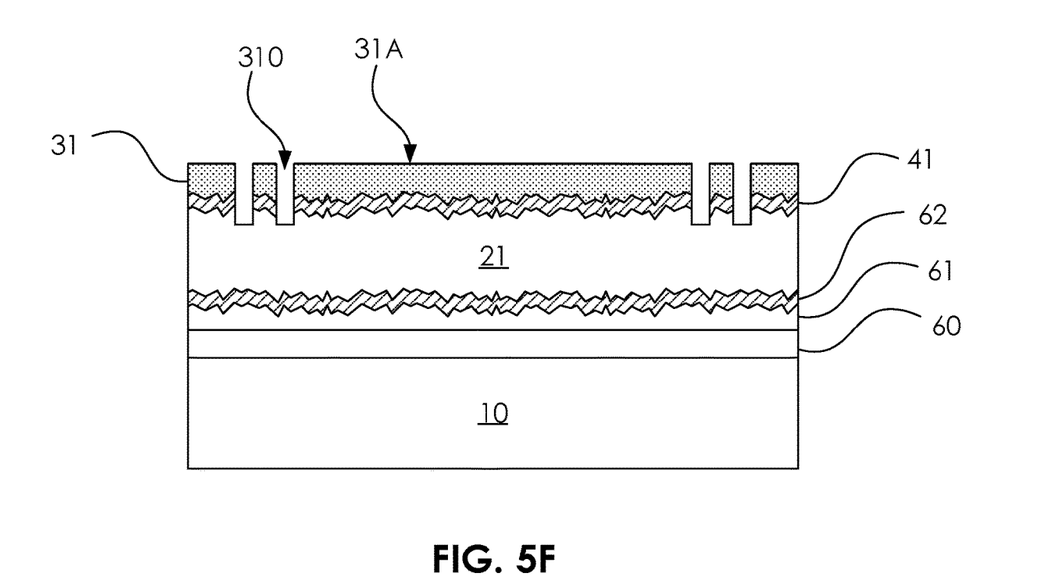
Figure 5G:
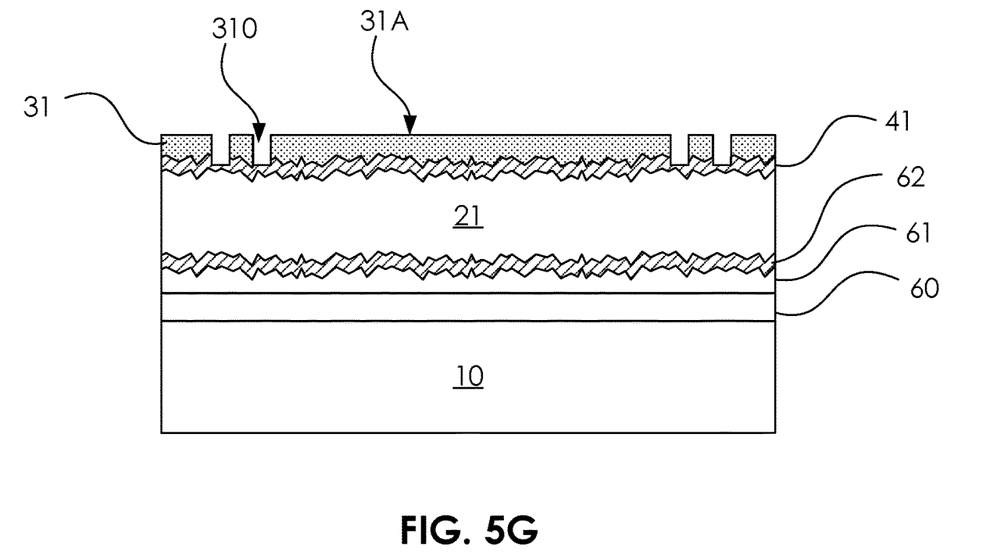

Referring to FIGS. 5F and 5G, in some embodiments, a plurality of trenches 310 may be formed in the first dummy layer 31 after the first dummy layer 31 is planarized. In some embodiments, the first dummy layer 31 and the first lower metal layer 41 are penetrated by the plurality of trenches 310. As shown in FIG. 5F, in some embodiments, the first piezoelectric layer 21 is exposed by forming the plurality of trenches 310, whereas in some other embodiments, as shown in FIG. 5G, the first piezoelectric layer 21 is not exposed after forming the plurality of trenches 310, which means the first lower metal layer 41 is exposed is enough.

Figure 5H:
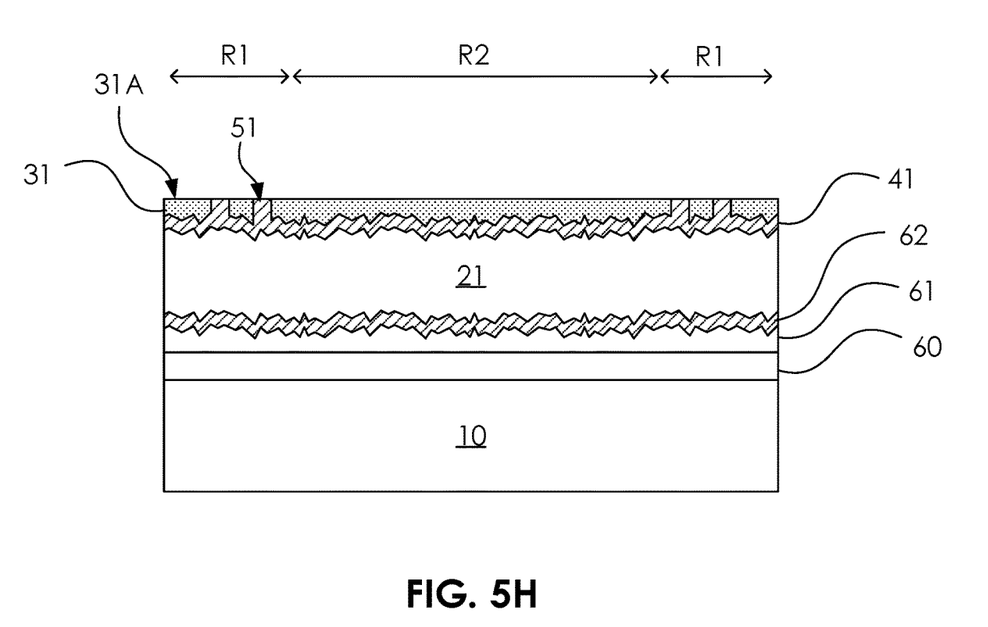

Referring to FIG. 5H, the plurality of trenches 310 (see FIG. 5G) are used to forming the plurality of first conductive vias 51. In some embodiments, the plurality of trenches 310 may be filled by a conductive material such as metal. In some embodiments, the plurality of first conductive vias 51 are made by the material identical to the material of the first lower metal layer 41.

Because the top surfaces of the first conductive vias 51 formed in the plurality of trenches 310 are not planarized, the roughness of the top surfaces of the first conductive vias 51 may be greater than the second top surface 31A. Therefore, in some embodiments, the plurality of trenches 310 are formed within the connection region R1 of the semiconductor structure. By arranging the first conductive vias 51 within the region for connection purpose, the average roughness of the second top surface 31A in the non-connection region R2 of the semiconductor structure may be maintained. In other words, the c-axis orientation of the piezoelectric layers in non-connection region R2 may be substantially enhanced by the planarization of the first dummy layer 31, and the piezoelectricity performance of the semiconductor structure may thus be ensured.

Figure 5I:
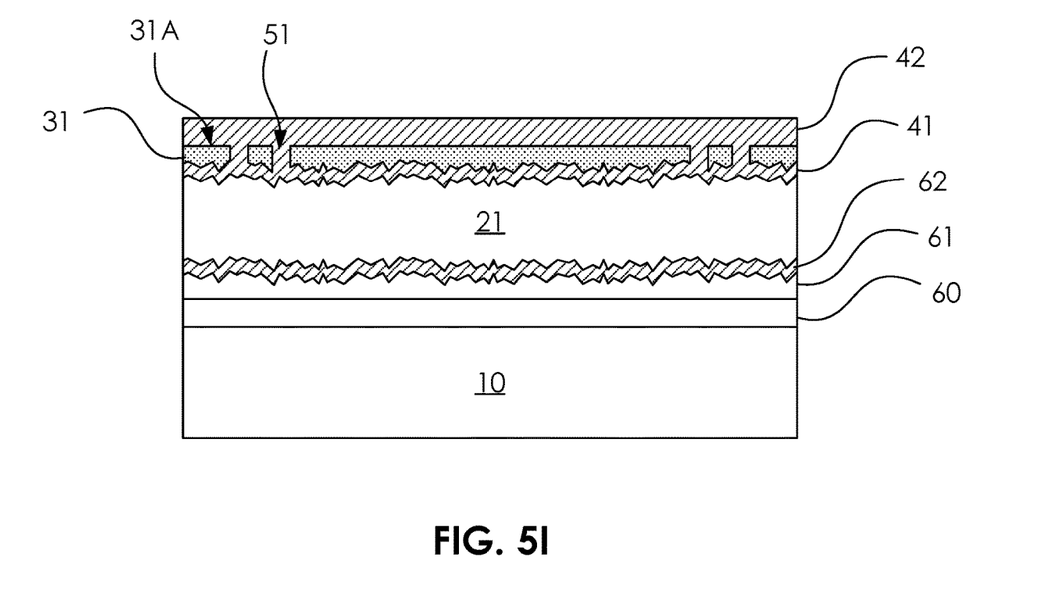

Referring to FIG. 5I, in some embodiments, the first upper metal layer 42 may be formed on the first dummy layer 31 after the first conductive vias 51 are formed. In some embodiments, the first upper metal layer 42 may be made by metal materials such as ruthenium (Ru), platinum (Pt), molybdenum (Mo), or the like. In some embodiments, the thickness of first upper metal layer 42 may be in a range of from about 10 nm to about 50 nm. In some embodiments, the thickness of the first upper metal layer 42 may be identical to the thickness of the first lower metal layer 41.

Figure 5J:
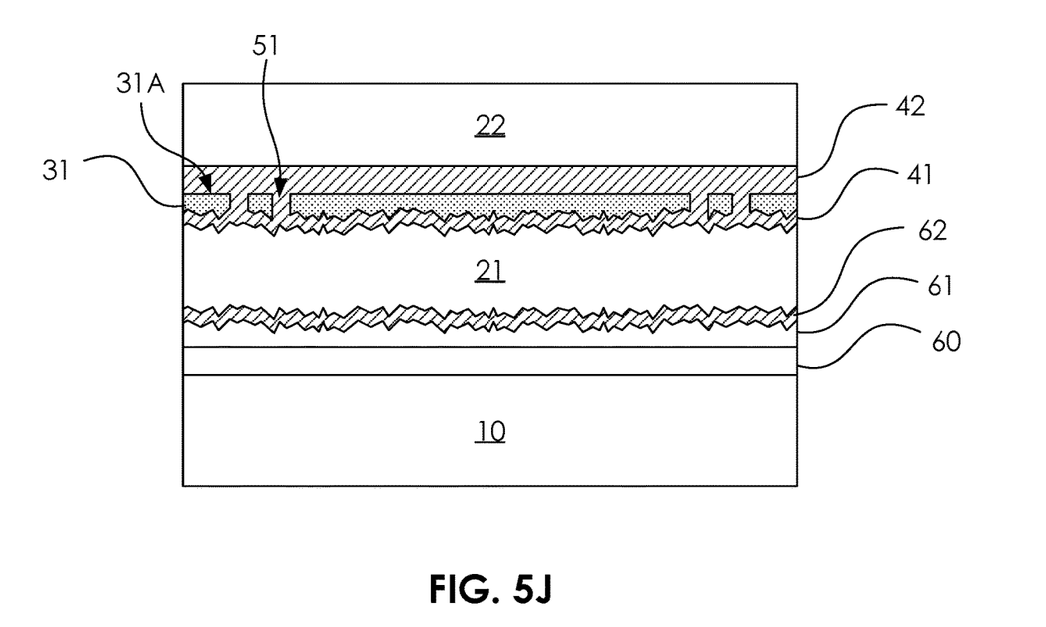

Referring to FIG. 5J, in some embodiments, the second piezoelectric layer 22 is formed on the first upper metal layer 42. In some embodiments, the material of the second piezoelectric layer 22 may be identical to the first piezoelectric layer 21 therebelow. In some embodiments, the thickness of the second piezoelectric layer 22 is in a range of from about 0.5 μm to about 5 μm. In some embodiments, the thickness of the second piezoelectric layer 22 is identical to the thickness of the first piezoelectric layer 21 therebelow. The second piezoelectric layer 22 may be made by aluminum nitride, scandium-doped aluminum nitride or other materials with piezoelectric property. In some embodiments, the material of the second piezoelectric layer 22 is identical to the material of the first piezoelectric layer 21.

Above the second piezoelectric layer 22, there may be more piezoelectric layers (or may be seen as piezoelectric bulks) formed thereon, and each of the piezoelectric layers may be covered by a dummy layer including a planarized smooth top surface, and therefore the crystal of the piezoelectric layers formed above the dummy layers may be highly oriented, and each of the piezoelectric layers may be electrically connected in series by the metal layers and conductive vias.

According to the present disclosure, a semiconductor structure and a method for manufacturing thereof are disclosed. The surfaces of the piezoelectric layers may be damaged by processes such as lithography, etching, or photoresist stripping, and may be effected by the abnormal grains generated from the adding of scandium, nevertheless, the present disclosure may overcome the issue of low c-axis orientation of the piezoelectric layer by utilizing a plurality of dummy layers between each two of the piezoelectric layers. The top surface of the dummy layer may be planarized prior to forming the piezoelectric layer thereover, and therefore the piezoelectric layer may be formed on a smooth surface rather than on a damaged surface or a rough surface with abnormal grains. Accordingly, a higher c-axis orientation of the piezoelectric layer may be achieved.

In one exemplary aspect, a semiconductor structure is provided. The semiconductor structure includes a substrate, a first piezoelectric layer, and a first dummy layer. The first piezoelectric layer is over the substrate, and the first piezoelectric layer has a first top surface. The first dummy layer is over the first piezoelectric layer, and the first dummy layer has a second top surface. And an average roughness of the first top surface is greater than an average roughness of the second top surface.

In another exemplary aspect, a semiconductor structure is provided. The semiconductor structure includes a substrate, a piezoelectric layer, and a dielectric layer. The piezoelectric layer is over the substrate. The dielectric layer is over the piezoelectric layer, and the dielectric layer has a top surface and a bottom surface. And an average roughness of the bottom surface is greater than an average roughness of the top surface.

In yet another exemplary aspect, a method or manufacturing a semiconductor structure is provided. The method includes the operations as follows. A substrate is provided. A first piezoelectric layer is formed over the substrate, and the first piezoelectric layer has a first top surface. A first dummy layer is formed over the first piezoelectric layer. The first dummy layer is planarized to form a second top surface.

And an average roughness of the first top surface is greater than an average roughness of the second top surface.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a first piezoelectric layer over the substrate, the first piezoelectric layer having a first upper surface;
   a first lower metal layer on the first upper surface of the first piezoelectric layer, a profile of an upper surface of the first lower metal layer is duplicated from a profile of the first upper surface of the first piezoelectric layer;
   a first dummy layer on the first lower metal layer, the first dummy layer having a second upper surface; and
   a first upper metal layer on the second upper surface of the first dummy layer, the first dummy layer is sandwiched by the first lower metal layer and the first upper metal layer;
   wherein an average roughness of the first upper surface is greater than an average roughness of the second upper surface.

2. The semiconductor structure of claim 1, wherein the average roughness of the second upper surface is lower than about 0.4 nm.

3. The semiconductor structure of claim 1, further comprising:
   a plurality of first conductive vias in the first dummy layer, electrically connecting the first lower metal layer and the first upper metal layer;
   wherein the plurality of first conductive vias are within a connection region of the semiconductor structure.

4. The semiconductor structure of claim 1, wherein the first piezoelectric layer comprises scandium.

5. The semiconductor structure of claim 3, further comprising:
   a second piezoelectric layer on the first upper metal layer; and
   a second dummy layer over the second piezoelectric layer.

6. The semiconductor structure of claim 5, further comprising:
   a second lower metal layer on the second piezoelectric layer; and
   a second upper metal layer on the first dummy layer;
   wherein the second lower metal layer and the second upper metal layer are electrically connected by a plurality of second conductive vias.

7. The semiconductor structure of claim 6, wherein the second conductive vias are within the connection region of the semiconductor structure.

8. A semiconductor structure, comprising:
   a substrate;
   a piezoelectric layer over the substrate;
   a lower metal layer on the piezoelectric layer;
   a dielectric layer on the lower metal layer, the dielectric layer having an upper surface and a lower surface; and
   an upper metal layer in contact with the upper surface of the dielectric layer, the dielectric layer is sandwiched by the upper metal layer and the lower metal layer;
   wherein an average roughness of the lower surface of the dielectric layer is greater than an average roughness of the upper surface of the dielectric layer.

9. The semiconductor structure of claim 8, wherein the dielectric layer is penetrated by a plurality of conductive vias.

10. The semiconductor structure of claim 9, wherein the lower metal layer and the upper metal layer are electrically connected by the plurality of conductive vias.

11. The semiconductor structure of claim 8, wherein an average roughness of an upper surface of the lower metal layer is greater than an average roughness of an upper surface of the upper metal layer.

12. The semiconductor structure of claim 8, wherein the average roughness of an upper surface of the lower metal layer is greater than about 0.4 nm.

13. A method for manufacturing a semiconductor structure, comprising:
    providing a substrate;
    forming a first piezoelectric layer over the substrate, the first piezoelectric layer having a first upper surface;
    forming a first lower metal layer on the first upper surface of the first piezoelectric layer, a profile of an upper surface of the first lower metal layer is duplicated from a profile of the first upper surface of the first piezoelectric layer;
    forming a first dummy layer on the first lower metal layer;
    planarizing the first dummy layer to form a second upper surface;
    forming a first upper metal layer on the second upper surface of the first dummy layer, the first dummy layer is sandwiched by the first lower metal layer and the first upper metal layer;
    wherein an average roughness of the first top upper surface is greater than an average roughness of the second top-upper surface.

14. The method of claim 13, further comprising:
    forming a plurality of trenches in the first dummy layer; and
    forming a plurality of conductive vias in the plurality of trenches.

15. The method of claim 13, wherein forming the first piezoelectric layer comprises forming a Sc-containing nitride layer.

16. The method of claim 14, wherein the plurality of trenches are formed within a connection region of the semiconductor structure.

17. The method of claim 13, wherein the second upper surface of the first dummy layer is planarized to an average roughness lower than about 0.4 nm.

18. The semiconductor structure of claim 1, wherein a profile of a lower surface of the first dummy layer is match to a profile of the upper surface of the first lower metal layer.

19. The semiconductor structure of claim 1, wherein a thickness of the first lower metal layer is in a range of from about 10 nm to about 50 nm.

20. The semiconductor structure of claim 1, wherein a thickness of the first lower metal layer is identical to a thickness of the first upper metal layer.

* * * * *